(12) United States Patent
Noguchi

(10) Patent No.: US 7,264,500 B2
(45) Date of Patent: Sep. 4, 2007

(54) PORTABLE ELECTRONIC APPARATUS WITH BATTERY ENGAGING TERMINAL

(75) Inventor: Eriko Noguchi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 11/353,604

(22) Filed: Feb. 14, 2006

(65) Prior Publication Data

US 2006/0189205 A1  Aug. 24, 2006

(30) Foreign Application Priority Data

Feb. 21, 2005  (JP)  ............................. 2005-043303

(51) Int. Cl.
*H01R 3/00* (2006.01)
*H01M 2/10* (2006.01)

(52) U.S. Cl. ..................................... 439/500
(58) Field of Classification Search ................ 439/500, 439/82, 751; 429/96, 100; 368/88, 204; 968/503

See application file for complete search history.

(56) References Cited

U.S. PATENT DOCUMENTS

| | | | | |
|---|---|---|---|---|
| 4,362,396 A | | 12/1982 | Perrot | ........................ 368/203 |
| 4,676,579 A | * | 6/1987 | Ting | ............................. 439/825 |
| 4,763,308 A | | 8/1988 | Morata | ......................... 367/88 |
| 5,073,119 A | * | 12/1991 | Soes | ............................. 439/82 |
| 5,186,634 A | * | 2/1993 | Thompson | .................... 439/82 |
| 5,796,588 A | * | 8/1998 | Machida et al. | ............ 361/773 |
| 6,087,037 A | | 7/2000 | Rieder | .......................... 429/99 |
| 6,309,259 B1 | * | 10/2001 | Yamashita | ................... 439/742 |
| 6,381,199 B1 | * | 4/2002 | Kroner et al. | .............. 368/203 |
| 6,515,865 B2 | * | 2/2003 | Johnson et al. | ............. 361/752 |
| 6,844,107 B2 | * | 1/2005 | Ohashi et al. | ................ 429/97 |
| 7,008,272 B2 | * | 3/2006 | Blossfeld | ..................... 439/751 |
| 7,112,388 B2 | * | 9/2006 | Kishida | ...................... 429/121 |

FOREIGN PATENT DOCUMENTS

| | | |
|---|---|---|
| DE | 10101050 | 7/2001 |
| EP | 1083467 | 3/2001 |

* cited by examiner

*Primary Examiner*—Neil Abrams
(74) *Attorney, Agent, or Firm*—Adams & Wilks

(57) ABSTRACT

A portable electronic apparatus comprises a frame having a recessed portion for receiving a battery. The recessed portion has a bottom portion that has an upper surface on which the battery seats. A circuit board is disposed beneath the frame and has two locking holes positioned at spaced-apart locations beneath a lower surface of the bottom portion. A negative battery terminal is disposed in an opening formed in the bottom portion. The negative battery terminal has two battery contact spring portions for elastically contacting a negative terminal of the battery and two locking spring portions that are sandwiched between the lower surface of the bottom portion and the circuit board. The two locking spring portions terminate in elastically deformable locking portions that are inserted into, and elastically deformed to make pressure contact with, inner walls of respective ones of the locking holes.

13 Claims, 5 Drawing Sheets

PORTABLE ELECTRONIC APPARATUS WITH BATTERY ENGAGING TERMINAL

BACKGROUND OF THE INVENTION

1. Field of the Invention

The present invention relates to an improvement in a battery connecting structure of a portable electronic apparatus of a wrist portable electronic timepiece, a heart beat transmitter of a heart beat measuring apparatus or the like.

2. Description of the Prior Art

JP-A-7-169451 discloses a battery connecting structure of an electronic timepiece in which a battery lead terminal is constituted by a pivotable structure in which one end thereof is provided with a portion brought into contact with a battery by constituting a fulcrum in the vicinity of a battery containing portion of a main plate and the other end thereof is provided with a portion brought into contact with a circuit board, and when the battery is contained in the containing portion, the battery lead terminal is pressed to be brought into contact with the circuit board. According to the battery connecting structure of the background art, there is achieved an effect that a screw for fixing the battery lead terminal is not needed. However, the battery connecting structure of the background art poses a problem that the battery connecting structure is applicable only to a battery lead terminal having a shape capable of adopting a pivotable structure.

FIG. 5 of JP-A-7-218659 discloses a battery connecting structure in which an electrode plate is directly fixed to a circuit board by press-fitting both end portions of the electrode plate into a locking hole board at the circuit board to be locked thereby. In sum, the battery connecting structure of the second background art is characterized in that in a battery connecting structure of a portable electronic timepiece directly fixing the minus battery terminal to the circuit board by utilizing the both end portions of the minus battery terminal comprising an elastic thin plate spring and the locking hole bored at the circuit board, the both end portions of the minus battery terminal are press-fitting portion directly press-fitted to the locking holes. However, there is a drawback that since the both end portions of the minus battery terminal are directly press-fitted to the circuit board per se to be fixed thereby, it is difficult to sufficiently ensure a press-fitting margin, further, since the both end portions of the minus battery terminal are brought into contact with the circuit board normally comprising a glass epoxy member, there poses a problem that harmful glass fiber powders are liable to be produced by abrasing to wear the circuit board by vibration, impact or the like of a product.

Hence, in order to resolve the problems, there is developed a battery connecting structure shown in FIG. 1 through FIG. 3 of JP-A-7-218659. The battery connecting structure of the third background art is a battery connecting structure in which a circuit board is mounted to a housing, the circuit board is mounted with a minus battery terminal having a board contact spring and a contact spring brought into contact with a battery, a locking portion is formed at at least one end portion of the minus battery terminal, and the minus battery terminal is fixed to the housing by locking the locking portion by a hold portion of the housing.

The battery connecting structure of the third background art is a simple structure. However, a digital wristwatch adopting the battery connecting structure of the third background art poses the following problem. That is, the housing needs to be formed with a locking hole for locking the locking portion of the electrode plate by the hold portion of the housing and therefore, an extra space is needed for the housing, and owing to the constitution of arranging a connector on an inner side of the locking hole and laying out a liquid crystal panel on the inner side to fix, product parting (display area) relative to a size of a product becomes very small. Further, it is necessary to make a minus electrode wiring region of the circuit board on a side of a battery face very large to bring about a layout which is disadvantageous in view of wiring. Since the wiring becomes disadvantageous, there is a high possibility of changing the board to a multilayered board, and in that case, not only the wiring becomes complicated but also the cost is increased. When the electrode wiring region is made to be small, there is needed an insulating sheet such that the circuit board wiring and the electrode plate are not short circuited. When the electrode plate is laid out on the inner side to make the wiring advantageous, the product parting becomes very small. Further, when the housing is provided with the locking hole for locking, the shape of the housing becomes complicated, the circuit board is pinched by the locking portion of the electrode plate and caught by the hold portion in the locking hole of the housing to fix and therefore, it is difficult to control a dimension of the locking portion of the electrode plate. Also integration is not easy by a repulsion force of the connector.

Further, in order to resolve the above-described problem of the second portable electronic apparatus, a fourth battery connecting structure has been developed and adopted in a digital timepiece on sale. As shown by FIG. 5, the fourth battery connecting structure of the background art is a battery connecting structure in which a circuit board 20 is provided with a locking hole 21 for coupling, hook-like catching portions 33a are provided at both ends of an electrode plate 30 constituting a minus terminal, the hook-like catching portions 33a are inserted into the locking hole 21 to penetrate head portions thereof, the minus terminal 30 is fixed to the circuit board 20 by catching jaws of the head portions by a back side of the circuit board 20.

In sum, the fourth portable electronic apparatus of the background art is characterized in that in the battery connecting structure of the portable electronic apparatus for directly fixing the battery minus terminal 30 to the circuit board 20 by utilizing the both end portions of the battery minus terminal 30 comprising an elastic thin plate spring and the locking hole 21 board at the circuit board 20, the both end portions of the battery minus terminal 30 are formed with a pair of the symmetrical hook-like catching portion 33a. The hook-like catching portion 33a is provided with a vertical portion having a length the same as a length of the locking hole 21 and the head portion substantially in a triangular shape formed at a front end of the vertical portion at a position of penetrating the locking hole 21 and therefore, also the above-described problems of the second and third battery connecting structures can almost be resolved.

However, according to the portable electronic apparatus of the fourth background art, there poses a problem that a shape of the hook-like catching portion 33a is complicated. Further, the length of the vertical portion of the hook-like catching portion 33a is determined in correspondence with a thickness of the circuit board 20 and therefore, when a separate product is intended to produce by changing the circuit board to the circuit board 20 having a different thickness, it is necessary to also change the electrode plate constituting the minus terminal 30. Further, there also poses a problem that the head portion substantially in the triangular shape of the hook-like catching portion 33a is projected from the back side of the circuit board 20, a product thickness is increased by an amount of projecting the head portion.

According to a first problem to be resolved by the invention, in a battery connecting structure of a portable electronic apparatus for directly connecting a minus battery terminal to a circuit board by utilizing both end portions of the minus battery terminal comprising an elastic thin plate and a locking hole bored at the circuit board, harmful glass fiber powders are prevented from being produced by abrasing and wearing the circuit board by vibration, impact or the like of a product and when changed to a circuit board having a different thickness, a change in the minus battery terminal is dispensed with.

According to a second problem to be resolved by the invention, in a portable electronic apparatus for directly connecting a minus battery terminal to a circuit board by utilizing both end portions of the minus battery terminal comprising an elastic thin plate and a locking hole bored at the circuit board, a portable electronic apparatus having a simple structure and low cost is provided.

SUMMARY OF THE INVENTION

In order to resolve the above-described first and second problems, in a battery connecting structure of a portable electronic apparatus for directly fixing a minus battery terminal to a circuit board by utilizing both ends of the minus battery terminal comprising an elastic thin plate and a locking hole bored at the circuit board, tongue shape locking spring portions formed at the both ends of the minus battery terminal are inserted into the locking holes, and the minus terminal is fixed to the circuit board by a contact pressure produced by bringing the tongue-like locking spring portion into contact with an inner wall of the locking hole to be deformed elastically.

BRIEF DESCRIPTION OF THE SEVERAL VIEWS OF THE DRAWINGS

A preferred form of the present invention is illustrated in the accompanying drawings in which.

DETAILED DESCRIPTION OF THE PREFERRED EMBODIMENTS

A connecting structure of a battery of a portable electronic apparatus according to the invention is characterized in that in a battery connecting structure of a portable electronic apparatus for directly connecting a minus battery terminal to a circuit board by utilizing both ends of the minus battery terminal comprising an elastic thin plate and a locking hole bored at the circuit board, tongue shape locking spring portions formed at the both ends of the battery minus terminal are inserted into the locking holes, the minus terminal is fixed to the circuit board by a contact pressure produced by bringing the tongue shape locking spring portions in contact with inner walls of the locking holes to be elastically deformed, and the tongue shape locking spring portions are constituted by a pair of tongue pieces having the same shape.

Embodiment 1

Figure 1:
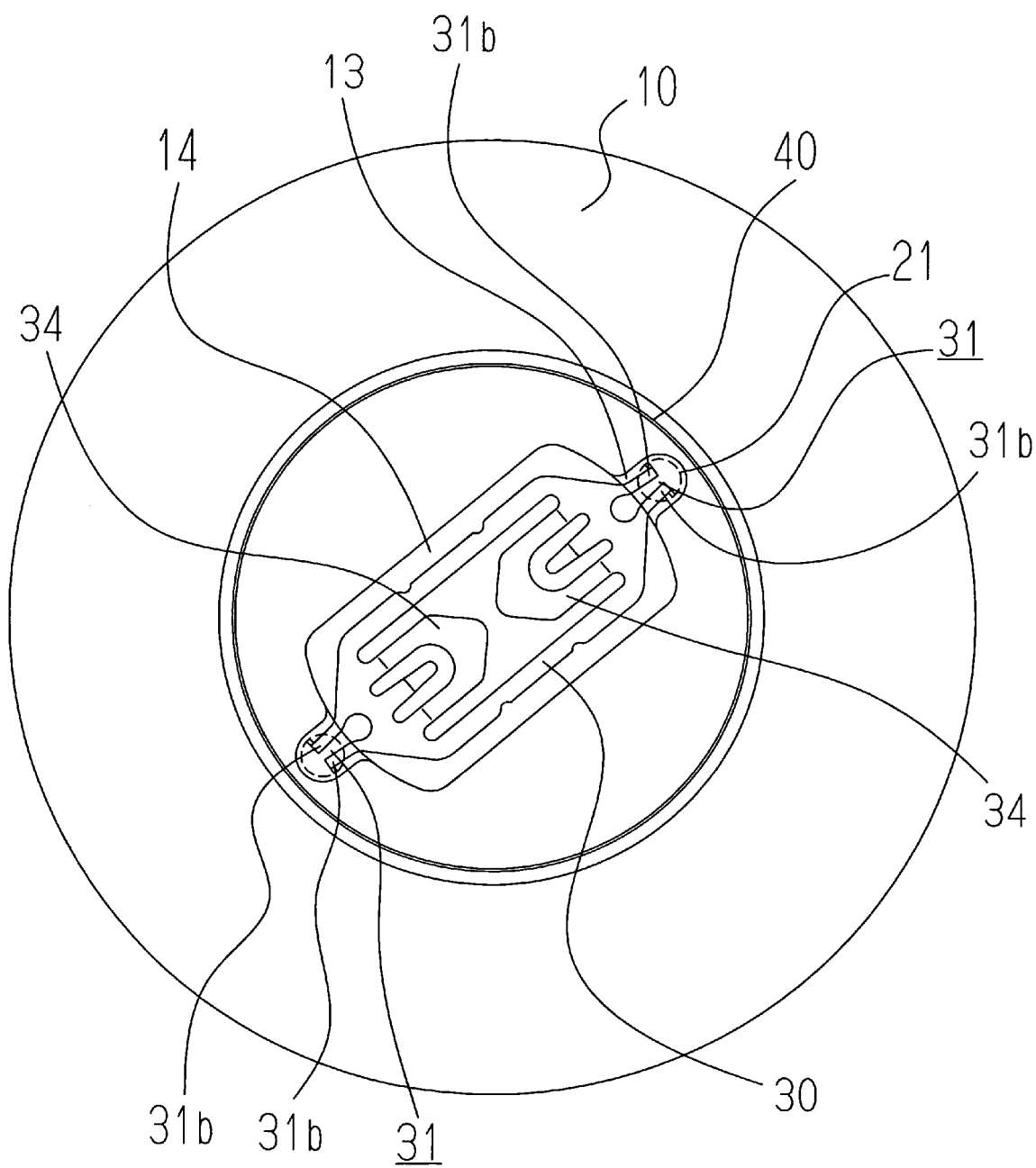
FIG. 1 is a plane view of a battery connecting structure of Embodiment 1 of the invention.
Figure 2:
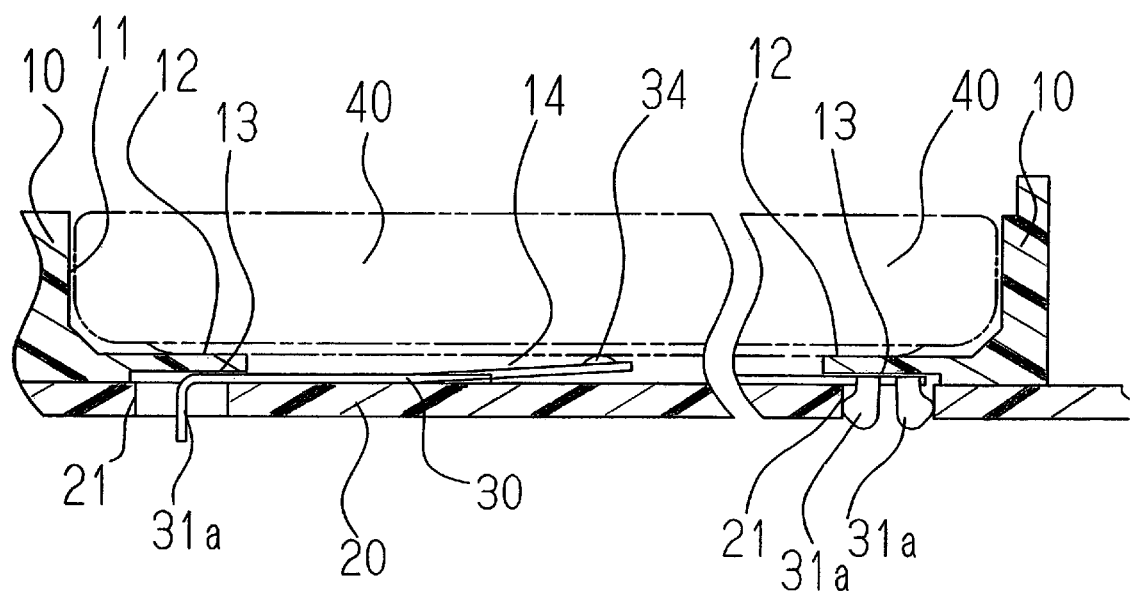
FIG. 2 is a partially sectional view of the battery connecting structure of Embodiment 1 of the invention, wherein a left side of the drawing is a partially sectional view cut along a center line in a longitudinal direction of a minus terminal 30 and a right side thereof is a partially sectional view cut orthogonally to the center line in the longitudinal direction at an end portion of the minus terminal 30.

According to Embodiment 1 of the invention, as shown by a plane view of FIG. 1 and a sectional view of FIG. 2, in a battery connecting structure of a portable electronic timepiece for directly connecting a minus or negative battery terminal 30 to a circuit board 20 by utilizing both ends of the battery minus terminal 30 formed of an elastic thin plate and a locking hole 21 in a circular shape formed in the circuit board 20, elastically deformable locking spring portions 31 in a shape of a tongue, a front end of which is split into two spaced-apart leg portions, formed at the both ends of the minus battery terminal 30 are inserted into the locking holes 21, and the minus terminal 30 is fixed to the circuit board 20 by a contact pressure produced by bringing the locking spring portion 31 in the shape of the tongue, the front end of which is split, into contact with inner walls of the locking holes 21 to be elastically deformed. A battery 40 is contained in a battery containing recess portion 11 of a frame 10 of the portable electronic timepiece, and the minus terminal 30 is arranged between a bottom face of the battery containing recess portion 11 and the circuit board 20. The bottom portion of the battery containing recess portion 11 is opened with a window or opening 14 at a center portion thereof, and the bottom portion has an upper surface or bottom face that surrounds the window 14 and constitutes a battery receiving face 12.

The minus terminal 30 according to Embodiment 1 is an elastic electrode plate substantially in a rectangular shape having a pair of battery contact spring portions 34, and the locking spring portions 31 having the shape of a tongue the front end of which is split are formed at the both ends. The front end of each locking spring portion 31 having the shape of the tongue is split to form a pair of spaced-apart tongue pieces or leg portions having the same shape. Further, the respective tongue pieces are a pair of tongue pieces symmetrical in a left and right direction having horizontal extended portions 31*b* and locking hole inserting (insertion) portions 31*a*.

Figure 3:
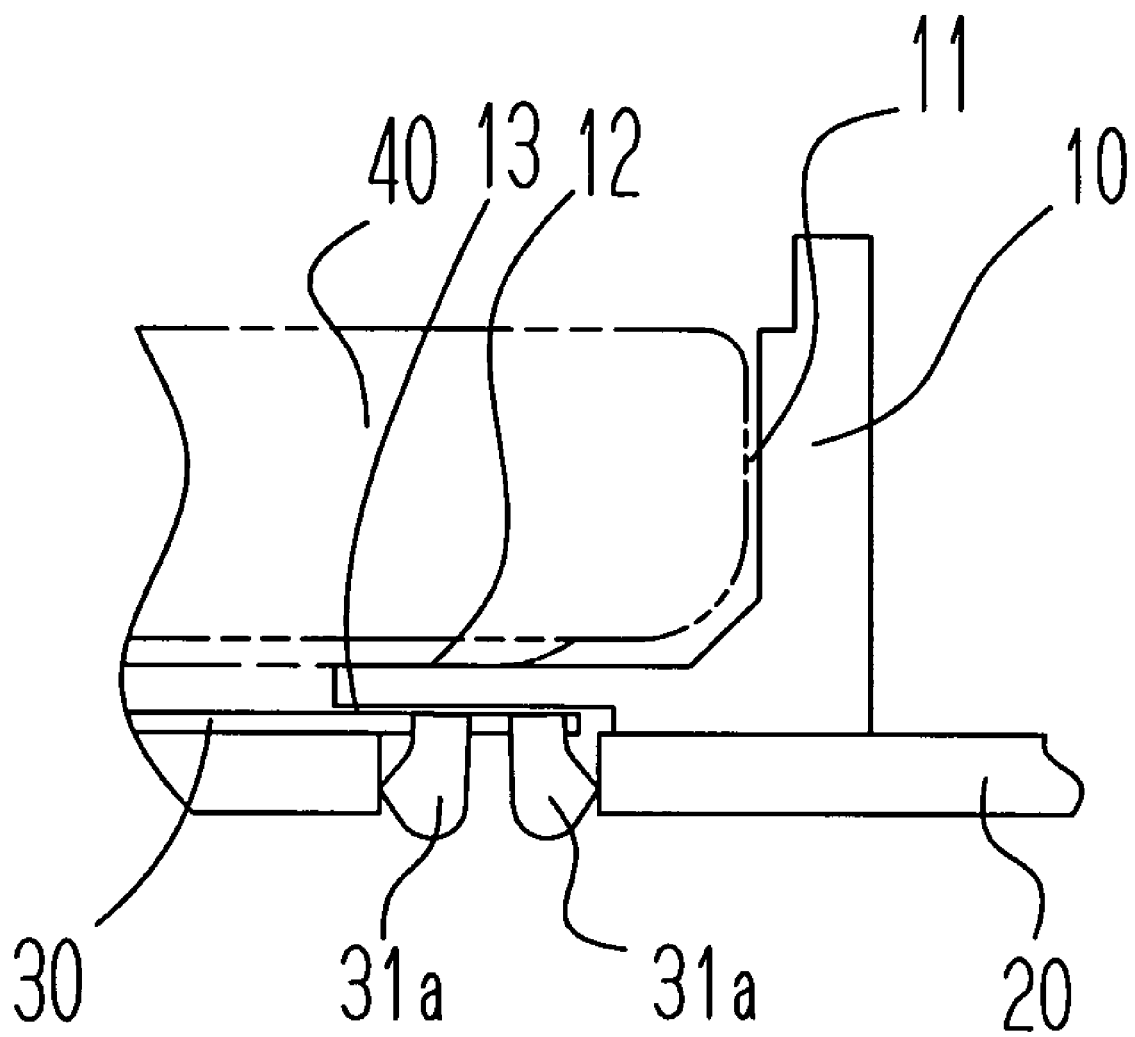
FIG. 3 is a partially sectional view of a modified example of a battery connecting structure of Embodiment 1 of the invention.

Each locking hole inserting portion 31*a* is formed with a projection that contacts or engages with the inner wall of the locking hole 21 bored at the circuit board 20. The projection may have a curved, such as semicircular, shape as shown by FIG. 2, or an angled, such as triangular, shape as shown by FIG. 3.

In integrating a movement of the portable electronic timepiece, when the minus terminal 30 is arranged at a predetermined position relative to the circuit board 20 and the locking hole inserting portions 31a of the locking spring portions 31 are inserted into the locking holes 21 of the circuit board 20, the minus terminal 30 is simply and firmly fixed to the circuit board 20. That is, because the tongue-like locking spring portion 31 is a locking spring portion having a shape of a tongue a front end of which is split and when a pair of the locking hole inserting portions 31a symmetrical in a left and right direction are inserted into the locking holes 21, the locking hole inserting portion 31a the tongue-like locking spring portion 31 is brought into contact with an inner wall thereof to be elastically deformed. By the contact pressure, the projection in the semicircular shape or the projection in the triangular shape of the locking hole inserting portion 31a bites into the inner wall of the locking hole 21 and the minus terminal 30 is fixed to the circuit board 20 further solidly.

Meanwhile, the locking hole inserting portion 31a of the minus terminal 30 before being integrated to the movement is disposed on a plane the same as that of a minus terminal main body similar to the horizontal extended portion 31b. When integrated to the movement as described above, the locking hole inserting portion 31a of the minus terminal 30 is bent substantially vertically from the horizontal extended portion 31b. However, the both ends of the minus terminal 30 are the locking spring portions 31 having the shape of the tongue the front end of which is split. Therefore, by only inserting the locking spring portion 31 having the shape of the tongue the front end of which is split of the minus terminal 30 into the locking hole 21 of the circuit board 20, a boundary portion of the locking hole inserting portion 31a and the horizontal extended portion 31b is more or less able to float or shift upwardly. To prevent this problem, the battery receiving face 12 of the frame 10 is formed to extend to a position covering the locking hole 21 of the circuit board 20 and the both ends of the battery minus terminal 30 are sandwiched between and pinched by hold portions 13 formed at the back face of the battery receiving face 12 and the circuit board 20. Thereby, the minus terminal 30 is prevented from floating or shifting upwardly.

As described above, the battery connecting structure of the portable electronic apparatus of embodiment 1 is a battery connecting structure of a simple structure at low cost of fixing the minus terminal 30 to the circuit board 20 by the contact pressure between the locking hole inserting portion 31a and the inner wall of the locking hole 21 in the circular shape produced by elastically deforming the locking spring portion 31 having the shape of the tongue the front end of which is split. Therefore, the front end portion of the locking hole inserting portion 31a does not penetrate the locking hole 21 and is not projected therefrom. Further, harmful glass fiber powders are not produced by abrasing and wearing the circuit board by vibration, impactor the like of the product. Further, in the portable electronic apparatus, even when changed to a circuit board having a different thickness, it is not necessary to change the battery minus terminal.

Embodiment 2

Figure 4A:
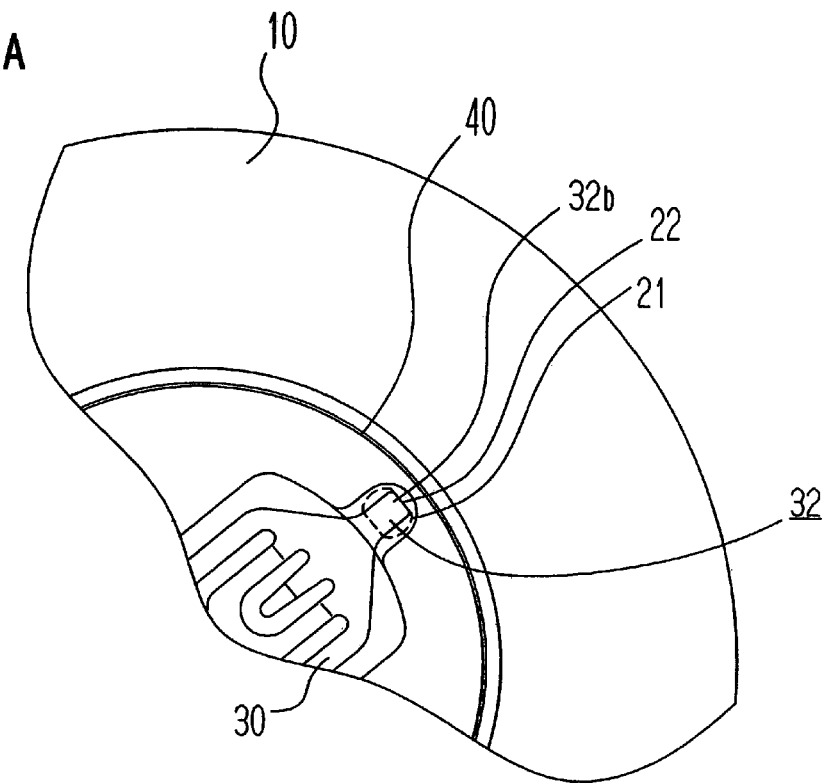
FIG. 4A illustrates a partial plane view and FIG. 4B illustrates and a partially sectional view of Embodiment 2 of the invention wherein in the partially sectional view of Fig. 4B, a left side of the drawing is a partially sectional view cut along the center line in the longitudinal direction of the minus terminal 30 and a right side thereof is a partially sectional view cut orthogonally to the center line in the longitudinal direction at the end portion of the minus terminal 30.
Figure 4B:
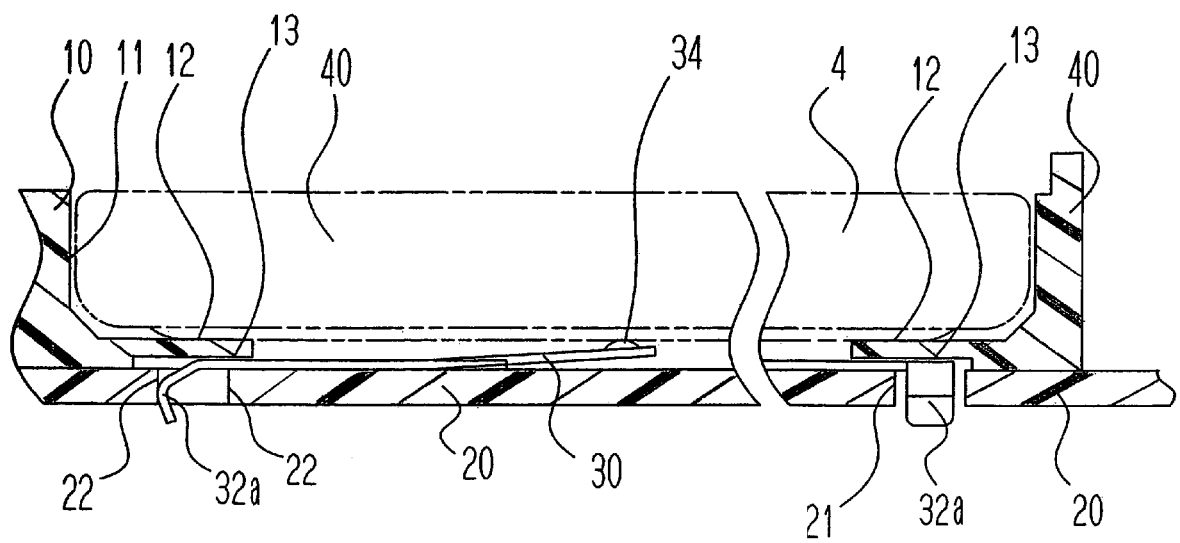
Figure 5:
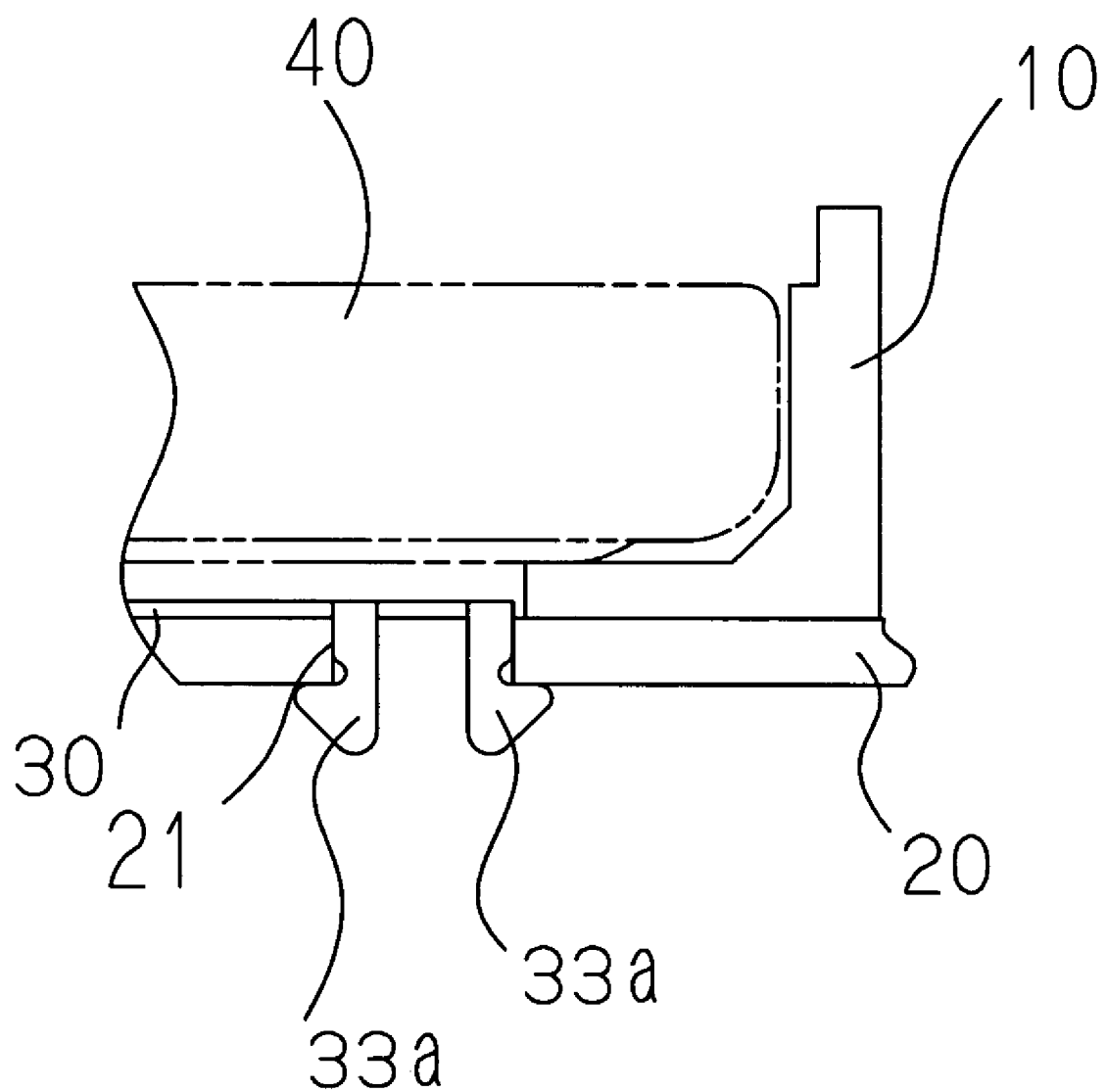
FIG. 5 is a sectional view of a battery connecting structure of a background art.

According to Embodiment 2 of the invention, as shown by a partial plane view of FIG. 4A and a partial sectional view of FIG. 4B, in a battery connecting structure of a portable electronic timepiece for directly fixing the minus or negative battery terminal 30 to the circuit board 20 by utilizing the both ends of the minus battery terminal 30 comprised of an elastic thin plate and a locking hole 22 in an elliptical shape bored at the circuit board 20, elastically deformable tongue shape locking spring portions 32 formed at the both ends of the battery minus terminal 30 are inserted into the locking holes 21, and the minus terminal 30 is fixed to the circuit board 20 by a contact pressure produced by bringing the tongue shape locking spring portion 32 into contact with the inner wall of the locking hole 22 to be elastically deformed thereby. The battery 40 is contained in the battery containing recess portion 11 of the frame 10 of the portable electronic timepiece, and the minus terminal 30 is arranged between the bottom face of the battery containing recess portion 11 and the circuit board 20. The bottom face of the battery containing recess portion 11 is opened with the window or opening 14 at the center portion and the bottom face at the surrounding of the window 14 constitutes the battery receiving face 12.

The minus battery terminal 30 according to Embodiment 2 comprises an elastic electrode plate substantially in a rectangular shape having a pair of battery contact spring portions 34 and the both ends of which are formed with the tongue shape locking spring portions 32 in the shape of a single short strip each having a horizontal extended portion 32b that terminates in a locking hole inserting (insertion) portion 32a. Further, the locking hole inserting portion 32a is formed as a tongue piece having a section substantially in a V-like shape.

In integrating the movement of the portable electronic timepiece, when the minus terminal 30 is arranged at the predetermined position of the circuit board 20, and the locking hole inserting portions 32a of the tongue shape locking spring portions 32 in the shape of a short strip formed at the both ends of the minus terminal 30 are inserted into the locking holes 22 of the circuit board 20, the minus terminal 30 is simply and firmly fixed to the circuit board 20. That is, because when the locking hole inserting portion 32a of the tongue shape locking spring portion 32 in the shape of the short strip is inserted into the locking hole 22 of the circuit board 20, a projected portion of the tongue piece having the section substantially in the V-like shape of the locking hole inserting portion 32a is brought into contact with the inner wall of the locking hole 22 and the tongue shape locking spring portion 31 in the shape of the short strip is elastically deformed to produce the contact pressure.

Meanwhile, the locking hole inserting portion 32a of the minus terminal 30 before being integrated to the movement is disposed on a plane the same as that of the minus terminal main body similar to the horizontal extended portion 32b. When integrated to the movement as described above, the locking hole inserting portion 32a of the minus terminal 30 is bent substantially vertically from the horizontal extended portion 32b. However, the both ends of the minus terminal 30 are the tongue shape locking spring portions 32 in the shape of the short strip. Therefore, by only inserting the tongue shape locking spring portion 32 in the shape of the short strip of the minus terminal 30 into the locking hole 22 of the circuit board 20, a boundary portion of the locking hole inserting portion 32a and the horizontal extended portion 32b can more or less float or shift upwardly. To obviate this problem, the battery receiving face 12 of the frame 10 is formed to extend to a position covering the locking hole 21 of the circuit board 20 and the both ends of the battery minus terminal 30 are sandwiched between and pinched by the hold portion 13 formed at the back face of the battery receiving face 12 and the circuit board 20. Thereby, the minus terminal 30 is prevented from floating or shifting upwardly.

As described above, the battery connecting structure of the portable electronic apparatus of Embodiment 2 is a battery connecting structure having a further simple structure at low cost for fixing the minus terminal 30 to the circuit board 20 by the contact pressure between the locking hole inserting portion 32a and the inner wall of the locking hole 22 in the elliptical shape produced by elastically deforming the tongue shape locking spring portions 32 in the shape of the short strip. Therefore, the front end portion of the locking hole inserting portion 32a hardly penetrates the locking hole 22 to be projected therefrom. The harmful glass fiber powders are not produced by abrasing and wearing the circuit board by vibration, impact or the like of the product. Further, in the portable electronic apparatus, when changed to a circuit board having a different thickness, it is not necessary to change the minus battery terminal.

By the invention, there is provided the battery connecting structure of the portable electronic apparatus for directly fixing the minus battery terminal to the circuit board by utilizing the both end portions of the minus battery terminal comprising the elastic thin plate and the locking hole bored at the circuit board, and the battery connecting structure having a simple structure at low cost. Further, by the invention, harmful glass fiber powders can be prevented from being produced by abrasing and wearing the circuit board by vibration, impact or the like of a product. Further, in the portable electronic apparatus, when changed to a circuit board having a different thickness, it is not necessary to change the minus battery terminal.

What is claimed is:

1. A portable electronic apparatus comprising: a frame having a recessed portion for receiving therein a battery during use of the portable electronic apparatus, the recessed potion having a bottom portion having an upper surface that receives thereon the battery and an opening provided in the bottom portion; a circuit board disposed beneath the frame, the circuit board having two locking holes positioned at spaced-apart locations beneath a lower surface of the bottom portion; and a negative battery terminal disposed in the opening of the bottom portion, the negative battery terminal having at least one battery contact spring portion for elastically contacting a negative terminal of the battery and two locking spring portions that are sandwiched and held between the lower surface of the bottom portion and the circuit board and that terminate in elastically deformable locking portions inserted into, and elastically deformed to make pressure contact with, inner walls of respective ones of the locking holes.

2. A portable electronic apparatus according to claim 1; wherein each locking portion has two spaced-apart leg portion that are sandwiched between the lower surface of the bottom portion and the circuit board, each leg portion terminating in a locking hole insertion portion, and the two leg portions being elastically deformed toward one another to enable insertion of the two locking hole insertion portions into the locking hole to make pressure contact with the inner wall of the locking hole.

3. A portable electronic apparatus according to claim 2; wherein each locking hole insertion portion has a projection that contacts the inner wall of the locking hole.

4. A portable electronic apparatus according to claim 3; wherein the projection has a curved shade.

5. A portable electronic apparatus according to claim 4; wherein the curved shape is a semicircular shape.

6. A portable electronic apparatus according to claim 3; wherein the projection has an angled shape.

7. A portable electronic apparatus according to claim 6; wherein the angled shape is a triangular shape.

8. A portable electronic apparatus according to claim 2; wherein the negative battery terminal comprises an elongate elastic plate having two locking spring portions at opposite ends thereof.

9. A portable electronic apparatus according to claim 8; wherein the elongate elastic plate has a rectangular shape.

10. A portable electronic apparatus according to claim 1; wherein each locking portion has a single strip portion that is sandwiched between the lower surface of the bottom portion and the circuit board, the strip portion terminating in a locking hole insertion portion that has a bent shape to enable the locking hole insertion portion to be elastically deformed and inserted into the locking hole to make pressure contact with the inner well of locking hole.

11. A portable electronic apparatus according to claim 10; wherein the bent shape of the locking hole insertion portion has a V-shape.

12. A portable electronic apparatus according to claim 10; wherein the negative battery terminal comprises an elongate elastic plate having two locking spring portions at opposite ends thereof.

13. A portable electronic apparatus according to claim 12; wherein the elongate elastic plate has a rectangular shape.

* * * * *